US007855397B2

(12) United States Patent
Alley et al.

(10) Patent No.: US 7,855,397 B2
(45) Date of Patent: Dec. 21, 2010

(54) ELECTRONIC ASSEMBLIES PROVIDING ACTIVE SIDE HEAT PUMPING

(75) Inventors: Randall G. Alley, Raleigh, NC (US); Philip A. Deane, Durham, NC (US); David A. Koester, Burlington, NC (US); Thomas Peter Schneider, Durham, NC (US); Jesko von Windheim, Wake Forest, NC (US)

(73) Assignee: Nextreme Thermal Solutions, Inc., Durham, NC (US)

( * ) Notice: Subject to any disclaimer, the term of this patent is extended or adjusted under 35 U.S.C. 154(b) by 269 days.

(21) Appl. No.: 12/016,720

(22) Filed: Jan. 18, 2008

(65) Prior Publication Data

US 2009/0072385 A1   Mar. 19, 2009

Related U.S. Application Data

(60) Provisional application No. 60/972,379, filed on Sep. 14, 2007.

(51) Int. Cl.
*H01L 33/00* (2010.01)
*H01L 23/34* (2010.01)
*H01L 35/02* (2010.01)
*H01L 21/00* (2010.01)

(52) U.S. Cl. ............... 257/99; 257/712; 257/713; 257/717; 257/E23.098; 257/E23.101; 257/E23.102; 136/203; 136/230; 438/108

(58) Field of Classification Search ............... 257/99, 257/712, 713, 717, E23.098, E23.101, E23.102; 438/108; 136/203, 230
See application file for complete search history.

(56) References Cited

U.S. PATENT DOCUMENTS 6,800,933 B1    10/2004   Mathews et al.
2006/0097383 A1*  5/2006  Ramanathan et al. ....... 257/712

(Continued)

OTHER PUBLICATIONS

Ettenberg et al. "A New n-type and Improved p-type Pseudo-ternary $(Bi_2Te_3)(Sb_2Se_3)$ Alloy for Peltier Cooling" 15$^{th}$ International Conference on Thermoelectrics, IEEE Catalog No. 96TH8169 pp. 52-56 (1996).
Kloeser "High-Performance flip chip packages with copper pillar bumping" *Global SMT & Packaging* pp. 28-31 (May 2006), www.globalsmt.net.

(Continued)

*Primary Examiner*—Long K Tran
(74) *Attorney, Agent, or Firm*—Myers Bigel Sibley & Sajovec, P.A.

(57) ABSTRACT

An electronic assembly may include a packaging substrate, an integrated circuit (IC) semiconductor chip, a plurality of metal interconnection structures, and a thermoelectric heat pump. The integrated circuit (IC) semiconductor chip may have an active side including input/output pads thereon and a back side opposite the active side, and the IC semiconductor chip may be arranged with the active side facing the first surface of the packaging substrate. The plurality of metal interconnection structures may be between the active side of the IC semiconductor chip and the first surface of the packaging substrate, and the plurality of metal interconnection structures may provide mechanical connection between the active side of the IC semiconductor chip and the first surface of the packaging substrate. The thermoelectric heat pump may be coupled to the packaging substrate with the thermoelectric heat pump being configured to actively pump heat between the IC semiconductor chip and the packaging substrate. Related methods and structures are also discussed.

11 Claims, 8 Drawing Sheets

U.S. PATENT DOCUMENTS

| | | |
|---|---|---|
| 2006/0128059 A1 | 6/2006 | Ahn et al. |
| 2006/0289050 A1 | 12/2006 | Alley et al. |
| 2006/0289052 A1 | 12/2006 | O'Quinn et al. |
| 2007/0012938 A1 | 1/2007 | Yu et al. |
| 2007/0089773 A1 | 4/2007 | Koester et al. |
| 2007/0120250 A1* | 5/2007 | Fairchild et al. ............ 257/712 |
| 2007/0215194 A1 | 9/2007 | Bharathan et al. |
| 2009/0057928 A1* | 3/2009 | Zhai et al. ................... 257/789 |

OTHER PUBLICATIONS

Venkatasubramanian et al. "Phonon-Blocking Electron-Transmitting Structures" 18th International Conference on Thermoelectrics (1999), pp. 100-103.

Snyder et al. "Hot Spot Cooling Using Embedded Thermoelectric Coolers" 22nd IEEE Semi-Therm Symposium, IEEE Catalog No. 1-4244-0154-2 pp. 135-143 (2006).

* cited by examiner

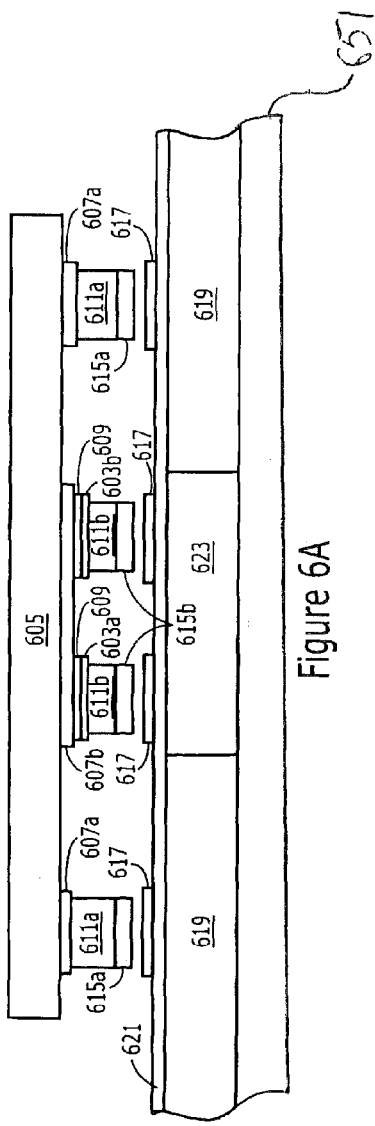
Figure 6A
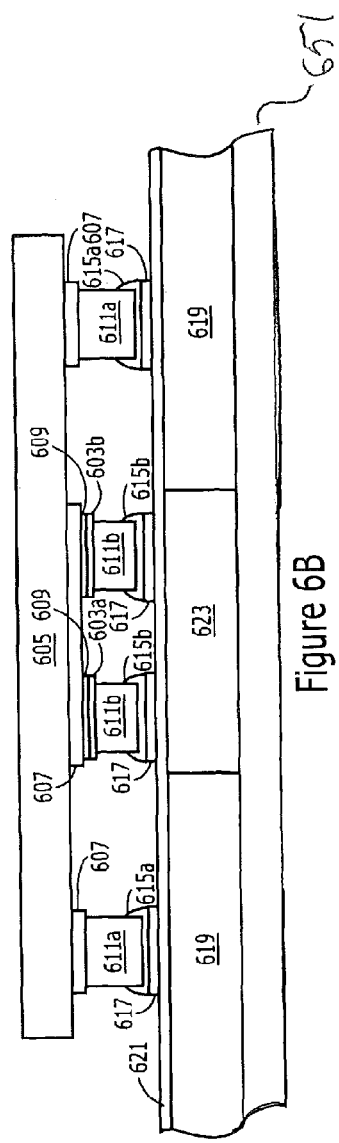
Figure 6B
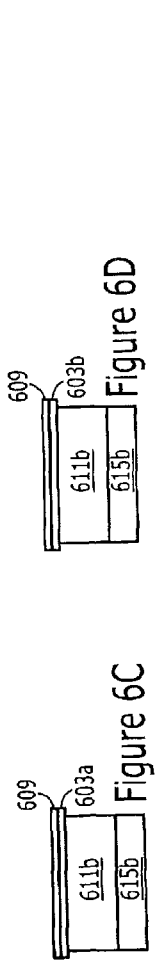
Figure 6D
Figure 6C

ELECTRONIC ASSEMBLIES PROVIDING ACTIVE SIDE HEAT PUMPING

RELATED APPLICATION

The present application claims the benefit of priority from U.S. Provisional Application No. 60/972,379 entitled "Active Thermoelectric Copper Pillar Solder Bumps" filed Sep. 14, 2007, the disclosure of which is hereby incorporated herein in its entirety by reference.

FIELD OF THE INVENTION

The present invention relates to the field of electronics, and more particularly, to thermoelectric heat pumping for electronic assemblies.

BACKGROUND

Thermoelectric materials may be used to provide cooling and/or power generation according to the Peltier effect. Thermoelectric materials are discussed, for example, in the reference by Venkatasubramanian et al. entitled "*Phonon-Blocking Electron-Transmitting Structures*" (18th International Conference On Thermoelectrics, 1999), the disclosure of which is hereby incorporated herein in its entirety by reference.

Application of solid state thermoelectric cooling may be expected to improve the performance of electronics and sensors such as, for example, RF receiver front-ends, infrared (IR) imagers, ultra-sensitive magnetic signature sensors, and/or superconducting electronics. Bulk thermoelectric materials typically based on p-$Bi_xSb_{2-x}Te_3$ and n-$Bi_2Te_{3-x}Se_x$ alloys may have figures-of-merit (ZT) and/or coefficients of performance (COP) which result in relatively poor thermoelectric device performance.

The performance of a thermoelectric device may be a function of the figure(s)-of-merit (ZT) of the thermoelectric material(s) used in the device, with the figure-of-merit being given by:

$$ZT=(\alpha^2 T\sigma/K_T),\qquad\text{(equation 1)}$$

where $\alpha$, T, $\sigma$, $K_T$ are the Seebeck coefficient, absolute temperature, electrical conductivity, and total thermal conductivity, respectively. The material-coefficient Z can be expressed in terms of lattice thermal conductivity ($K_L$), electronic thermal conductivity ($K_e$) and carrier mobility ($\mu$), for a given carrier density ($\rho$) and the corresponding $\alpha$, yielding equation (2) below:

$$Z=\alpha^2\sigma/(K_L+K_e)=\alpha^2/[K_L/(\mu\rho q)+L_0 T)],\qquad\text{(equation 2)}$$

where, $L_0$ is the Lorenz number (approximately $1.5\times10^{-8} V^2/K^2$ in non-degenerate semiconductors). State-of-the-art thermoelectric devices may use alloys, such as p-$Bi_xSb_{2-x}Te_{3-y}Se_y$ (x≈0.5, y≈0.12) and n-$Bi_2(Se_yTe_{1-y})_3$ (y≈0.05) for the 200 degree K to 400 degree K temperature range. For certain alloys, $K_L$ may be reduced more strongly than $\mu$ leading to enhanced ZT.

A ZT of 0.75 at 300 degree K in p-type $Bi_xSb_{2-x}Te_3$ (x≈1) was reported forty years ago. See, for example Wright, D. A., Nature vol. 181, pp. 834 (1958). Since then, there has been relatively modest progress in the ZT of thermoelectric materials near 300 degree K (i.e., room temperature). A ZT of about 1.14 at 300 degree K for bulk p-type $(Bi_2Te_3)_{0.25}$ $(Sb_2Te_3)_{0.72}$ $(Sb_2Se_3)_{0.03}$ alloy has been discussed for example, in the reference by Ettenberg et al. entitled "*A Stew N-Type And Improved P-Type Pseudo-Ternary $(Bi_2Te_3)$ $(Sb_2Te_3)(Sb_2Se_3)$ Alloy For Peltier Coolng*," (Proc. of 15th Inter. Conf. on Thermoelectrics, IEEE Catalog. No. 96TH8169, pp. 52-56, 1996), the disclosure of which is hereby incorporated herein in its entirety by reference.

Notwithstanding the above mentioned advances in thermoelectric materials, there continues to exist a need in the art for improved thermoelectric device structures and assembly methods.

SUMMARY

According to some embodiments of the present invention, an electronic assembly may include a packaging substrate, an integrated circuit (IC) chip, a plurality of metal interconnection structures, and a thermoelectric heat pump. The packaging substrate may have opposing first and second surfaces, and the IC semiconductor chip may have an active side including input/output pads thereon and a back side opposite the active side. More particularly, the IC semiconductor chip may be arranged with the active side facing the first surface of the packaging substrate. The plurality of metal interconnection structures may be between the active side of the IC semiconductor chip and the first surface of the packaging substrate, and the plurality of metal interconnection structures may provide mechanical connection between the active side of the IC semiconductor chip and the first surface of the packaging substrate. The thermoelectric heat pump may be coupled to the packaging substrate, and the thermoelectric heat pump may be configured to actively pump heat between the IC semiconductor chip and the packaging substrate. The thermoelectric heat pump may also be configured to actively pump heat between the first and second surfaces of the packaging substrate.

The thermoelectric heat pump may be between the packaging substrate and the IC semiconductor chip. In addition, the packaging substrate may include a thermally conductive via (such as a copper via) between the first and second surfaces thereof, and at least a portion of the thermoelectric heat pump may be between the thermally conductive via and the IC semiconductor chip. The thermoelectric heat pump may include an n-type thermoelectric element electrically coupled to a first one of the metal interconnection structures and a p-type thermoelectric element electrically coupled to a second one of the metal interconnection structures. The IC semiconductor chip may include an electrically conductive coupling between the first and second metal interconnection structures so that the n-type and p-type thermoelectric elements are electrically coupled in series, and so that the n-type and p-type thermoelectric elements are thermally coupled in parallel between the IC semiconductor chip and the packaging substrate. Moreover, a third one of the metal interconnection structures may be electrically coupled between an electronic circuit of the IC semiconductor chip and an electrically conductive trace of the packaging substrate.

The packaging substrate may be between the thermoelectric heat pump and the IC semiconductor chip. The packaging substrate may include a thermally conductive via (such as a copper via) between the first and second surfaces thereof, and the thermally conductive via may be between the thermoelectric heat pump and the IC semiconductor chip. Moreover, the thermoelectric heat pump may include n-type and p-type thermoelectric elements on the second surface of the packaging substrate, the n-type and p-type thermoelectric elements may be electrically coupled in series with each other, and the n-type and p-type thermoelectric elements may be thermally coupled in parallel between the thermally conductive via and a thermally conductive header.

A heat dissipating structure (such as a heat sink) may be thermally coupled to the thermoelectric heat pump with the packaging substrate between the IC semiconductor chip and the heat dissipating structure. Each of the plurality of metal interconnection structures may include a copper pillar and a solder material.

The packaging substrate may include a thermally conductive via between the first and second surfaces thereof, and the thermoelectric heat pump, the thermally conductive via, and one of the metal interconnection structures may be thermally coupled in series between the active side of the IC semiconductor chip and the second surface of the packaging substrate. Another of the metal interconnection structures may provide electrical coupling between a circuit of the IC semiconductor chip and an electrically conductive trace of the packaging substrate. Moreover, the packaging substrate may be a thermally conductive packaging substrate.

According to some other embodiments of the present invention, an electronic assembly may include a packaging substrate, an integrated circuit (IC) semiconductor chip, and a plurality of metal interconnection structures. The IC semiconductor chip may have an active side including input/output pads thereon, and the IC semiconductor chip may be arranged with the active side facing the packaging substrate. The plurality of metal interconnection structures may be between the IC semiconductor chip and the packaging substrate. More particularly, a first metal interconnection structure may include a thermoelectric material, and a second metal interconnection structure may be free of thermoelectric material. In addition, a third metal interconnection structure may include a P-type thermoelectric material, and the first and third metal interconnection structures may be electrically coupled so that the N-type thermoelectric material and the P-type thermoelectric material are electrically coupled in series to define a thermoelectric P-N couple.

The packaging substrate may include a thermally conductive via therethrough adjacent at least one of the metal interconnection structures including thermoelectric material. Each of the metal interconnection structures may include a copper pillar and a solder bond.

According to still other embodiments of the present invention, a method of forming an electronic assembly may include flip-chip bonding an integrated circuit (IC) semiconductor chip having an active side including input/output pads thereon to a packaging substrate. More particularly, the IC semiconductor chip may be bonded so that the active side faces the packaging substrate, and flip-chip bonding may be provided using a plurality of metal interconnection structures between the IC semiconductor chip and the packaging substrate. A first metal interconnection structure may include a thermoelectric material, and a second metal interconnection structure may be free of thermoelectric material. In addition, a third metal interconnection structure may include a P-type thermoelectric material, and the first and third metal interconnection structures may be electrically coupled so that the N-type thermoelectric material and the P-type thermoelectric material are electrically coupled in series to define a thermoelectric P-N couple.

The packaging substrate may include a thermally conductive via therethrough adjacent at least one of the metal interconnection structures including thermoelectric material. Each of the metal interconnection structures may include a copper pillar and a solder bond.

According to yet other embodiments of the present invention, an electronic assembly may include a packaging substrate, an integrated circuit (IC) semiconductor chip, a plurality of metal interconnection structures, and a thermoelectric element. The packaging substrate may have opposing first and second surfaces, and the IC semiconductor chip may have an active side including input/output pads thereon and a back side opposite the active side. Moreover, the IC semiconductor chip may be arranged with the active side facing the first surface of the packaging substrate. The plurality of metal interconnection structures may be between the active side of the IC semiconductor chip and the first surface of the packaging substrate, and the plurality of metal interconnection structures may provide electrical and mechanical connection between the active side of the IC semiconductor chip and the first surface of the packaging substrate. The thermoelectric element may be on the second surface of the packaging substrate so that the packaging substrate is between the thermoelectric element and the IC semiconductor chip. In addition, the thermoelectric element may include a P-N couple having P-type and N-type thermoelectric elements electrically coupled in series.

The packaging substrate may include a thermally conductive via therethrough between the thermoelectric P-N couple and the IC semiconductor chip. In addition, a heat spreader may be on the thermoelectric P-N couple so that the P-type and N-type thermoelectric elements are thermally coupled in parallel between the packaging substrate and the heat spreader.

According to more embodiments of the present invention, a method of forming an electronic assembly may include bonding an integrated circuit (IC) semiconductor chip having an active side including input/output pads thereon to a packaging substrate so that the active side faces a first surface of the packaging substrate. In addition, a thermoelectric element may be formed on a second surface of the packaging substrate so that the packaging substrate is between the thermoelectric element and the IC semiconductor chip. In addition, the thermoelectric element may include a P-N couple having P-type and N-type thermoelectric elements electrically coupled in series.

The packaging substrate may include a thermally conductive via therethrough between the thermoelectric P-N couple and the IC semiconductor chip. A heat spreader may be provided on the thermoelectric P-N couple so that the P-type and N-type thermoelectric elements are thermally coupled in parallel between the packaging substrate and the heat spreader.

BRIEF DESCRIPTION OF THE DRAWINGS

FIGS. 6A, 6B, 6C, and 6D are cross sectional views illustrating operations of forming an electronic assembly according to some embodiments of the present invention.

DETAILED DESCRIPTION

Figure 1:
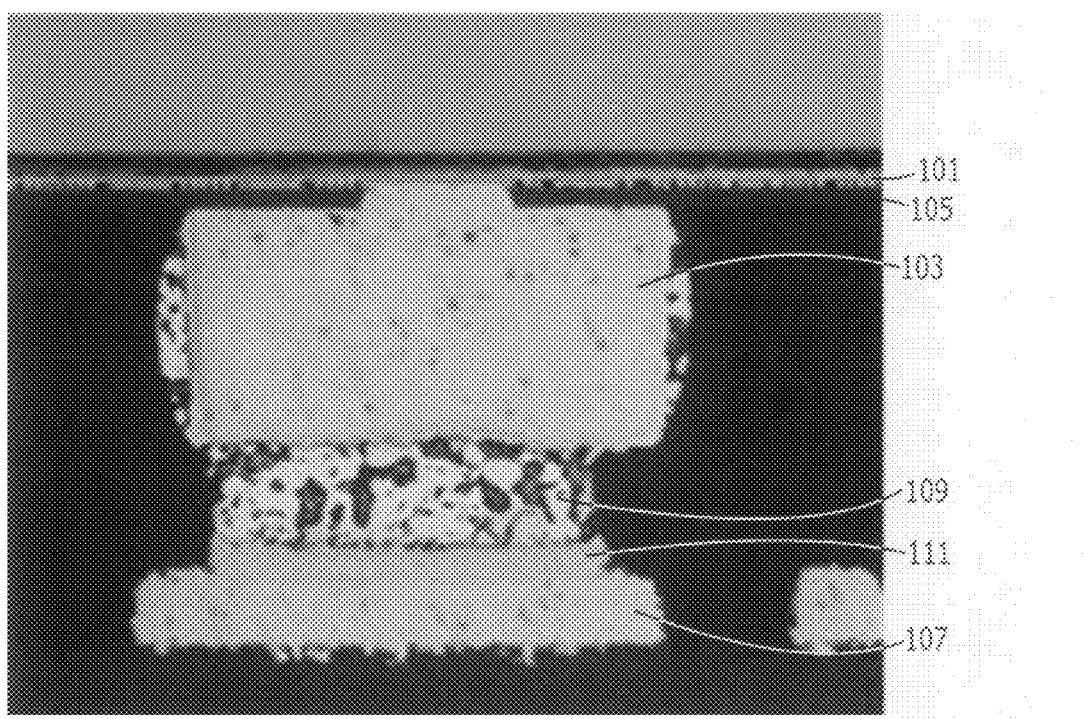
FIG. 1 is a scanning electron microscope (SEM) image illustrating an example of a copper pillar and solder interconnection structure.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Copper pillar solder bumps (also referred to as CPBs and/or copper pillar solder interconnection structures) have been developed to provide flip-chip bonding as discussed, for example, in the reference by Joachim Kloeser et al. entitled "*High-Performance Flip Chip Packages With Copper Pillar Bumping*" (Global SMT & Packaging, May 2006, pages 28-31), the disclosure of which is hereby incorporated herein in its entirety by reference. CPBs may provide an attractive replacement for traditional solder bumps. First, the pitch of a CPB is not dictated by a large volume of solder but rather by the size of the plated copper pillars thereby providing a significantly smaller pitch than traditionally available with all-solder bumps. Second, an amount of solder needed to create a bump may be substantially reduced because a majority of the interconnect volume may be copper. In the case of lead-based solders, a volume of lead may be reduced which may be important for environmental concerns (e.g., Restriction of Hazardous Substance or RoHS compliance). Third, copper has a substantially higher thermal conductivity than most binary or ternary solders. For example, eutectic SnPb (63% Sn, 37% Pb) has a thermal conductivity of approximately 40 W/mK as compared with 386 W/mK for copper. A CPB may thus provide approximately 10× improvement in conductive thermal transport over traditional solder bumps of the same geometry. Fourth, because copper pillars may not significantly change shape during reflow, they may be less susceptible to volumetric redistribution that can lead to voids (defects) in the solder bump that may increase parasitic resistance and compromise reliability.

FIG. 1 is a scanning electron microscope (SEM) image illustrating an example of a CPB interconnection structure fabricated as discussed, for example, by Joachim Kloeser in the reference entitled "*High-Performance Flip Chip Packages With Copper Pillar Bumping*" (Global SMT & Packaging, May 2006, pages 28-31), the disclosure of which is hereby incorporated herein in its entirety by reference. The cross-section shows a copper trace 101 and a copper pillar 103 (approximately 60 um in height) electrically connected through a via in a chip passivation layer 105 at the top of the picture. At the bottom, another copper trace 107 is provided on a package substrate with solder 109 between the two copper layers. In addition, a barrier layer 111 may be provided between the solder 109 and the copper trace 107.

Thin-film thermoelectric devices have been demonstrated to provide high heat pumping capacity that may far exceed that demonstrated by traditional bulk pellet TE products as discussed, for example, in the reference by G. J. Snyder et al. entitled "*Hot Spot Cooling Using Embedded Thermoelectric Coolers*" (Proc. 22$^{nd}$ IEEE Semi-Therm Symp, 2006), the disclosure of which is hereby incorporated herein in its entirety by reference. Some benefits of thin-films over thick, bulk materials for thermoelectric manufacturing are expressed in Equation 3. Here the $Q_{max}$ (maximum heat pumped by a module) is shown to be inversely proportional to the thickness of the film, L.

$$Q_{max} = \frac{S^2 T^2}{2 \cdot R_{Total}} = \frac{S^2 T^2 A}{2\rho_c L} \qquad \text{(equation 3)}$$

As such, TE (thermoelectric) coolers manufactured with thin-films can have in the range of 10-times to 40-times higher $Q_{max}$ values for a given active area, A. Thin-film TECs (thermoelectric coolers) may thus be suited for applications involving relatively high heat-flux flows. In addition to increased heat pumping capability, use of thin film thermoelectric materials may allow for new implementations of TE devices. Instead of a bulk module that is 1-3 mm in thickness, a thin-film TEC can be fabricated less than 100 um (micrometers) in thickness. In a simple form, a P-type or N-type leg (or element) of a TE couple (the basic building block of a TE device) may be a layer of thin-film TE material with a solder layer above and below to provide electrical and thermal coupling to electrical traces.

Figure 2A:
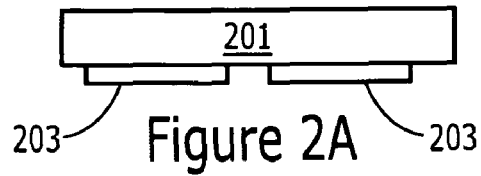
FIGS. 2A-D are cross-sectional views illustrating assembly of a single PN couple according to some embodiments of the present invention.

FIGS. 2A-D are cross-sectional views illustrating assembly of a single PN couple. As shown in FIG. 2A, a thin film layer of a thermoelectric material (such as bismuth telluride or $Bi_2Te_3$) may be epitaxially grown on a sacrificial single crystal substrate 201 (such as a gallium arsenide or GaAs substrate) and then patterned to provide separate thermoelectric elements 203. P-type and N-type thermoelectric elements may be separately formed on different substrates. A substrate with P-type thermoelectric elements may be diced to provide separate P-type thermoelectric elements, and a substrate with N-type thermoelectric elements may be diced to provide separate N-type thermoelectric elements.

Figure 2B:
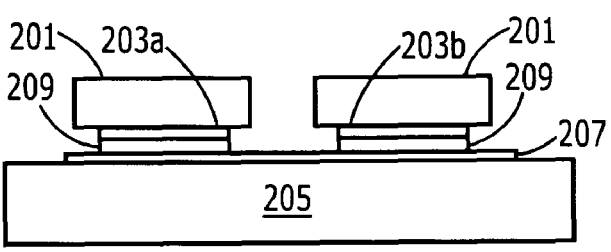
Figure 2C:
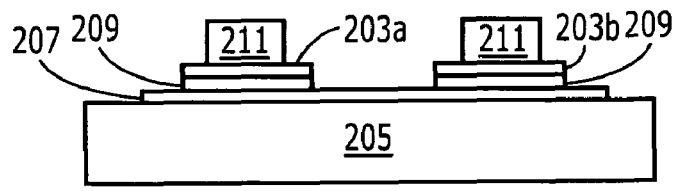

As shown in FIG. 2B, a first header 205 (such as a thermally conductive ceramic header) may include a conductive metal trace 207 thereon, and a P-type thermoelectric element 203*a* and an N-type thermoelectric element 203*b* may be bonded to the metal trace 207, for example, using solder layers 209. As shown in FIG. 2B, portions of the sacrificial substrate(s) 201 may be maintained on the thermoelectric elements 203*a* and 203*b* after bonding the respective thermoelectric elements 203*a* and 203*b* to the metal trace 207. As shown in FIG. 2C, remaining portions of the sacrificial substrates 201 may be removed, and metal contact pillars 211 (e.g., copper pillars, also referred to as copper posts) may be formed (e.g. electroplated) on the thermoelectric elements 203*a* and 203*b*. A second header 219 with complementary traces 217 may be bonded to the metal contact pillars 211, for example, using solder layers 215.

According to some embodiments of the present invention, the first header 205 may be an integrated circuit (IC) semiconductor chip, and the second header 219 may be a packaging substrate such as a printed circuit board substrate, a laminate carrier substrate, a chip carrier, a ball grid array substrate, a pin grid array substrate, a flip chip package substrate, a printed wire board, etc. More particularly, the integrated circuit semiconductor chip (as the first header 205) may include an active side having electronic devices thereon adjacent the metal trace(s) 207 and a backside opposite the active side. While not shown in FIGS. 2A-D, electrical and mechanical coupling may be provided between electronic circuits on the active side of the integrated circuit semiconductor chip (as the first header 205) and the second header 219 using metal interconnection structures such as the copper pillar solder bump structure of FIG. 1. Accordingly, metal interconnection structures and thermoelectric cooling structures may be provided on integrated circuit (IC) semiconductor chips at wafer or chip level (i.e., before or after dicing the IC semiconductor chips) and bonded to corresponding traces of the packaging substrate at the same time.

According to some other embodiments of the present invention, the second header 219 may be an IC semiconductor chip, and the first header 201 may be a packaging substrate such as a printed circuit board substrate, a laminate carrier substrate, a chip carrier, a ball grid array substrate, a pin grid array substrate, a flip chip package substrate, a printed wire board, etc. More particularly, the integrated circuit semiconductor chip (as the second header 219) may include an active side having electronic devices thereon adjacent the metal trace(s) 217 and a backside opposite the active side. While not shown in FIGS. 2A-D, electrical and mechanical coupling may be provided between electronic circuits on the active side of the integrated circuit semiconductor chip (as the second header 219) and the first header 201 using metal interconnection structures such as the copper pillar solder bump structure of FIG. 1. Accordingly, metal interconnection structures and thermoelectric cooling structures may be provided on the packaging substrate and bonded to corresponding traces of the IC semiconductor chip at the same time.

By providing the thermoelectric elements 203 of a thermoelectric cooler between the flip chip IC semiconductor device and the packaging substrate, thermoelectric cooling may be provided more directly adjacent heat generating circuitry on the active side of the IC semiconductor device without requiring heat transfer through the IC semiconductor device to a back side thereof. In addition, operations of forming the thermoelectric cooler may be integrated with operations of flip chip packaging. Moreover, alignment of the thermoelectric cooler with a known hot spot on the active side of the IC semiconductor chip may be more easily facilitated than if thermoelectric cooling is provided on the backside of the IC semiconductor chip. If the packaging substrate is thermally conductive, further modification thereof may not be required. If the packaging substrate is not thermally conductive (e.g., a printed circuit board substrate, a laminate carrier substrate, etc.), a thermally conductive via(s) (e.g., a copper via) may be provided through the packaging substrate adjacent the thermoelectric elements 203 to enhance thermal conduction through the packaging substrate.

Figure 2D:
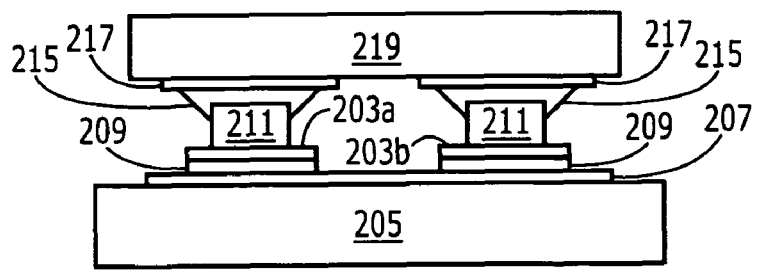
Figure 3:
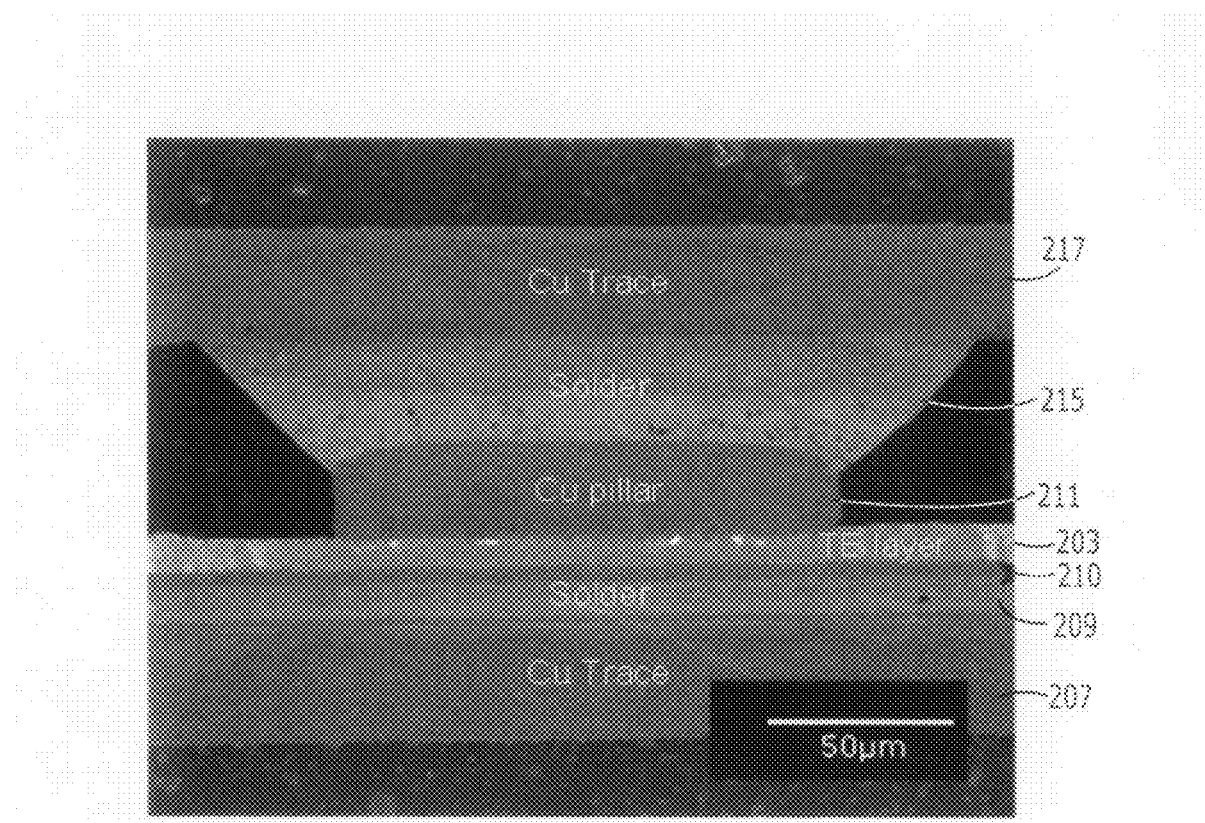
FIG. 3 is a scanning electron microscope (SEM) image illustrating a cross-section of a thermoelectric (TE) element according to some embodiments of the present invention.

FIG. 3 is a scanning electron microscope (SEM) image illustrating a cross-section of a thermoelectric (TE) element or leg (as shown, for example, in FIG. 2D). The stack of FIG. 3, for example, may include copper trace 207, solder 209, thermoelectric (TE) element 203, copper pillar 211, solder 215, and copper trace 217. In addition, a barrier layer 210 (e.g., a layer including nickel) may be provided between solder 209 and TE element 203.

The TE leg may thus include structural elements of a CPB with the addition of a layer of a TE material 203, incorporated into the stack. The addition of the layer of the TE material 203 may transform a copper pillar solder interconnection structure into an active thermoelectric copper pillar bump (or TECPB). A TECPB may be approximately 100 μm (micrometer) in height. The copper pillar 211 may be 100 to 200 μm (micrometer) in diameter and 20 to 40 μm (micrometer) in height but the diameter may be smaller than 100 μm (micrometer) or larger than 200 μm (micrometer) in some embodiments. The TE element 203 may be on the order of 10 to 20 μm (micrometer) in thickness but can be greater than 20 μm (micrometer) and possibly as thick as 50 μm (micrometer) or more in some embodiments. When the copper traces 207 and/or 217 above and/or below the TE element 203 and copper pillar 211 are fabricated external to the IC semiconductor chip or packaging substrate, these traces may be 20 to 30 μm (micrometer) in thickness. Internal metal traces in the IC semiconductor chip and/or on the packaging substrate can be used instead of external traces thereby further thinning the TECPB. Moreover, the TE element 203 may be a substantially single crystal layer of an n-type or p-type thermoelectric semiconductor material, such as $Bi_2Te_3$.

A TE element, when properly configured, electrically and thermally, may provide active thermoelectric heat transfer or pumping from one side of the TE element to the other side. A direction of heat transfer may be dictated by the doping type of the TE element (either an n-type or p-type semiconductor material) and the direction of electrical current through the TE element. This type of thermoelectric heat transfer is known as the Peltier effect. Conversely, if heat is allowed to pass from one side of the TE element to the other, a current may be generated in the TE element due to a phenomenon known as the Seebeck effect. The Seebeck effect is essentially the reverse of the Peltier effect. In this mode, electrical power may be generated from the flow of heat in the TE element. The structure shown in FIG. 3 may be capable of operating in both the Peltier and Seebeck modes.

Figure 4:
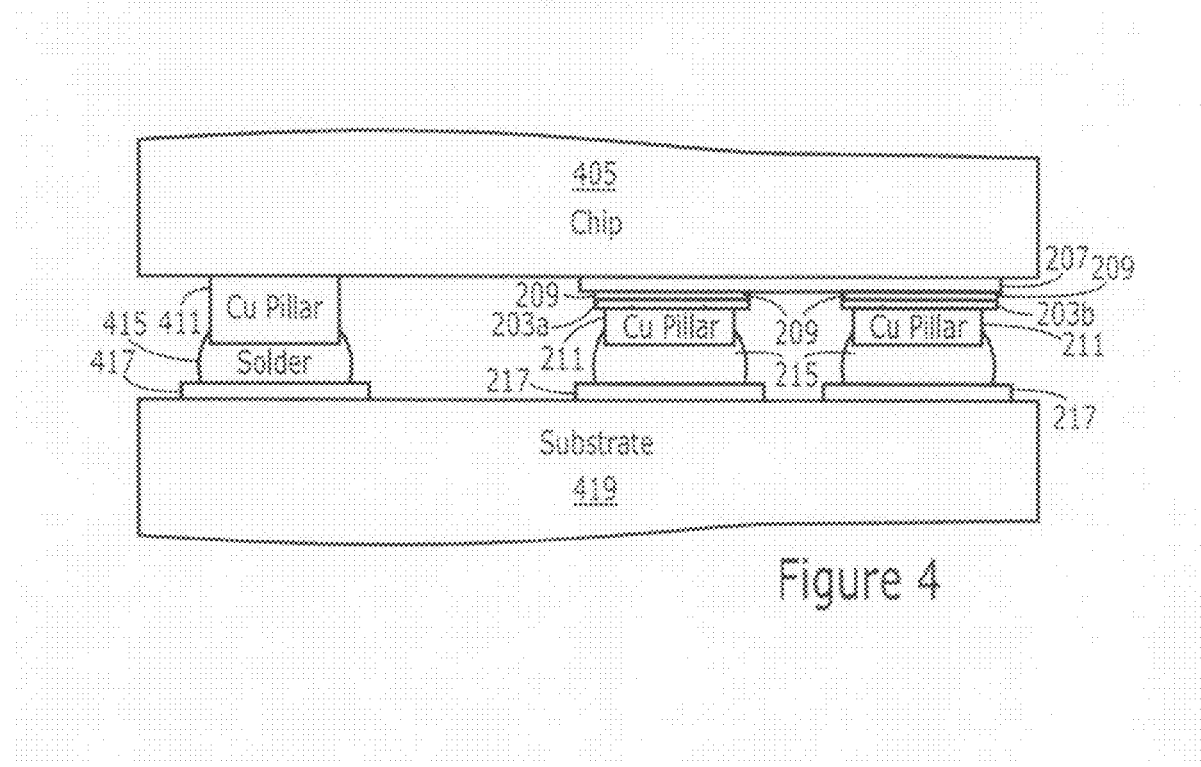
FIG. 4 is a cross-sectional schematic view illustrating structures of a copper pillar bump (CPB) and a thin-film thermoelectric copper pillar bump (TECPB) integrated in a flip chip IC semiconductor chip assembly according to some embodiments of the present invention.

FIG. 4 is a cross-sectional schematic view illustrating structures of a CPB and a thin-film TECPB integrated in a flip chip IC semiconductor chip assembly according to some embodiments of the present invention. The CPB and TECPB structures both include copper pillars 411 and 211, respectively, and solder connections 415 and 215, respectively. Each TECPB, however, may also include a layer of a P-type thermoelectric material 203a or a layer of an N-type thermoelectric material 203b between two solder layers 209 and 215. The solders used with CPBs and TECPBs can be any one of a number of commonly used solders including, but not limited to, SnPb (tin lead) eutectic, SnAg (tin silver) and/or AuSn (gold tin).

By way of example, the trace(s) 207, solder layers 209, layers of TE material 203a and 203b, copper pillars 211 and 411, and solder layers 215 and 415 may be formed on an active side of the IC semiconductor chip 405 before dicing the chip 405 from a processing wafer (including a plurality of such chips). The chip 405 can then be diced from the wafer and bonded to traces 217 and 417 of packaging substrate 419 using solder 215 and 415. The copper pillar 411 and solder 415 may provide electrical coupling between an electronic circuit(s) on the active side of the chip 405 and the trace 417 of the substrate 419, and electrically conductive traces and/or vias in/on the packaging substrate 419 may provide electrical coupling with other electronic components. The copper pillar 411, solder 415, and trace 417, for example, may provide electrical coupling with an input/output pad, a ground pad, and/or a power pad of the chip 405. The traces 217 may provide electrical coupling (through electrically conductive traces and/or vias in/on the packaging substrate 419) with a controller used to control operations of thermoelectric heating, cooling, and/or power generation.

While only one CPB interconnection structure (including copper pillar 411 and solder layer 415) is shown in FIG. 4 by way of example, any number of CPB interconnection structures may be used to provide electrical and/or mechanical connection between the IC chip and the packaging substrate 419. Similarly, any number of P-N pairs of TECPBs may be provided between the IC chip 415 and the packaging substrate 419. Moreover, a thermally conductive via(s) may be provided through the packaging substrate 419 adjacent the TECPBs to enhance thermal conduction through the packaging substrate 419. The TECPBs may be used to cool and/or heat the IC chip 405 and/or to generate electricity responsive to heat generated by the IC chip 405.

Figure 5:
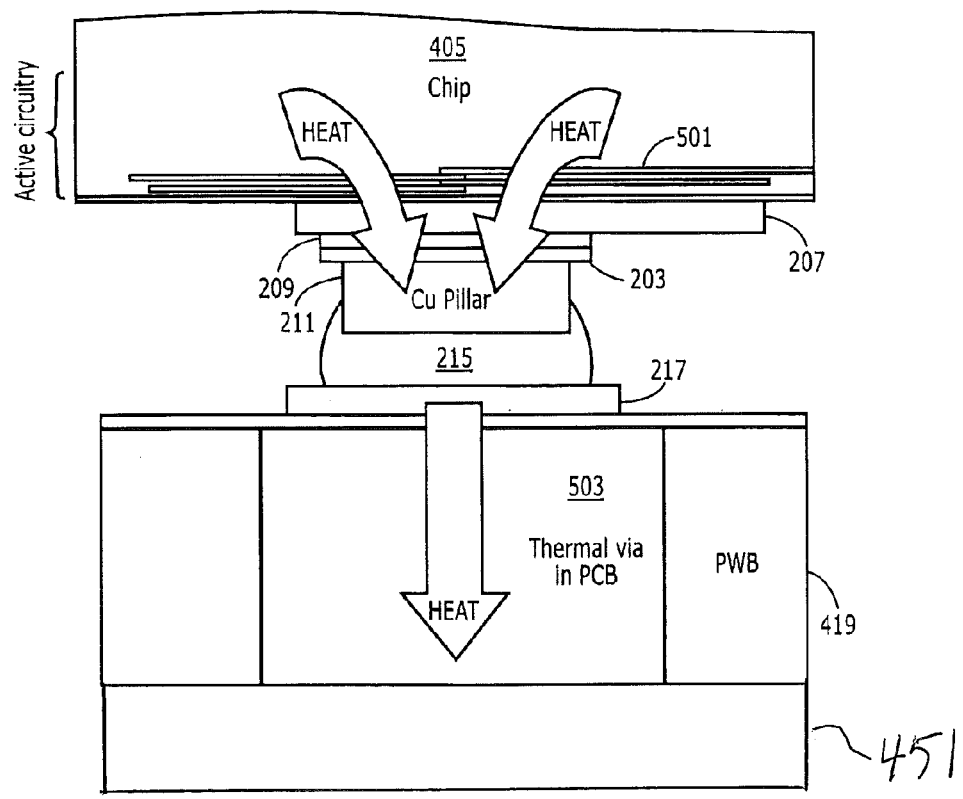
FIG. 5 is a cross sectional view illustrating an expanded view of a TECPB according to some embodiments of the present invention.

FIG. 5 is a cross sectional view illustrating an expanded view of a TECPB according to some embodiments of the present invention. Additional elements of TECPBs are also shown. Thermal flow in the assembly is shown by the arrows labeled "heat". Heat flow through the TECPB may be assisted using metal traces 501 on the chip. The traces 501 (that can be several micrometers in thickness and can be stacked and/or interdigitated) may provide highly conductive pathways used to collect heat from the underlying circuit(s) and to funnel that heat to the TECPB. The metal traces 501 shown in the figure and used to conduct heat into the TECPB may or may not be directly connected to the circuitry of the IC chip 405. In either case, on-board temperature sensors and/or driver circuitry may be used to control the TECPB in a closed loop fashion for improved performance.

For example, multiple insulating/passivation layers may be provided on the active side of the IC chip 405 to allow multiple levels of electrically conductive interconnections on the semiconductor substrate of the IC chip 405, and/or to protect the active side of the IC chip 405. The metal traces 501 may be provided between the insulating/passivation layers to channel heat to the TECPB.

Moreover, heat that is pumped by the TECPB and additional heat created by the TECPB in the course of pumping heat, may be rejected into the packaging substrate 419. Since thermal performance of the TECPB can be improved by providing a good thermal path for the rejected heat, a thermally conductive via 503 (such as a copper via) may be used to provide a high thermal conductivity pathway to the backside of the packaging substrate 419. For example, the packaging substrate 419 may be a multilayer substrate such as a printed circuit board (also referred to as a PCB, a printed wiring board, and/or a PWB) designed to provide a high density of interconnections. In this case, thermal conductivity of the PCB may be relatively poor and adding thermal vias (e.g., metal plugs) may provide an improved pathway for rejected heat. According to some other embodiments of the present invention, the packaging substrate may be a highly conductive substrate such as an AlN substrate or a metal (e.g., Cu, CuW, CuMo, Al, etc.) substrate with a dielectric layer thereon. In this case, the high thermal conductance of the substrate may act as a natural pathway for the rejected heat without using thermal vias.

A heat spreader, a heat sink, and/or other heat dissipating structure 451 may be provided on the packaging substrate 419 to facilitate transfer of heat away from the packaging substrate 419. By way of example, a heat dissipating structure may be provided on packaging substrate 419 adjacent the thermally conductive via 503 so that the thermally conductive via 503 is between the IC chip 405 and the heat dissipating structure.

Because TECPBs may be similar in structure and may use processing techniques similar to those used to manufacture CPBs, implementation of these structures may be integrated with CPB based processes used to provide flip chip interconnections between an IC chip and a packaging substrate. For example, CPBs may provide mechanical connection and electrical connection (e.g., for power, ground, and input/output pads of an IC chip); the TECPBs may provide heating, cooling, and/or power generation; and the CPBs and TECPBs and/or portions thereof may be formed at the same time between an IC chip and a packaging substrate.

TECPBs according to embodiments of the present invention can be used in different ways to provide temperature control for the IC chip. For example, TECPBs can be evenly distributed across an active side of an IC chip to provide an evenly distributed cooling effect. In this case, the TECPBs may be interspersed with standard CPBs that are used to couple input/output signals, power, and/or ground to/from the IC chip. The TECPBs may thus be placed directly adjacent active circuitry of the IC chip to provide improved effectiveness. A number and/or density of TECPBs may be based on a heat load from the IC chip. Each P/N couple can provide a specific heat pumping (Q) at a specific temperature differential ($\Delta T$) at a given electrical current. Temperature sensors on the IC chip (i.e., "on board" sensors) can provide direct measurement of the TECPB performance and provide feedback to the TEC driver circuit.

According to other embodiments of the present invention, precision temperature control may be provided for an IC chip. Because TECPBs can either cool or heat the IC chip depending on the current direction, the TECPBs can be used to provide precision temperature control so that an IC chip may operate within specific temperature ranges irrespective of ambient conditions. For example, TECPBs on an active side of an optoelectronic component IC chip may be controlled to provide cooling when a temperature of the optoelectronic component IC chip is too high and heating when a temperature of the optoelectronic component IC chip is too low.

According to still other embodiments of the present invention, TECPBs may be used to provide hotspot cooling for a particular hotspot on an active side of an IC chip. In microprocessors, graphics processors, and other high-end IC chips, a hotspot(s) on an active side of the IC chip may occur because power densities may vary significantly across the active side of the IC chip. These hotspots may significantly reduce performance of the IC chip. Because of the relatively small size of the TECPBs and the relatively high density at which the TECPBs can be placed on the active side of the IC chip, TECPB structures may be particularly suited for cooling hotspots. In such a case, a distribution of the TECPBs across the active side of the IC chip may not need to be even. Rather, the TECPBs may be concentrated in the area of the hotspot while areas of lower heat density may have fewer TECPBs per unit area. In this way, cooling from the TECPBs may be applied where needed, thereby reducing power used to drive cooling and also reducing a general thermal overhead on the system.

In addition to IC chip cooling/heating, TECPBs can be applied to high heat-flux interconnects to provide a substantially constants steady source of power. Such a source of power, typically in the mW range, may be used to trickle charge batteries for wireless sensor networks and/or other battery operated systems.

FIGS. 6A and 6B are cross sectional views illustrating operations of forming an electronic assembly according to some embodiments of the present invention. As shown in FIG. 6A, a packaging substrate 619 may include an electrically insulating layer 621 thereon and a plurality of bonding traces/pads 617 corresponding to respective pads/traces 607a-b of integrated circuit (IC) semiconductor chip 605. Before bonding the IC chip 605 and the packaging substrate 619, metal interconnections structures may be provided on the pads 607a of the IC chip 605, and P-type and N-type thermoelectric elements may be provided on the trace 607b of the IC chip 605.

Each metal interconnection structure, for example, may include a copper pillar 611a and a solder layer 615a on a respective conductive copper pad 607a. The copper pillars 611a and solder layers 615a may be formed as discussed, for example, by Joachim Kloeser et al. in the reference entitled "High-Performance Flip Chip Packages With Copper Pillar Bumping" (Global SMT & Packaging, May 2006, pages 28-31), the disclosure of which is hereby incorporated herein in its entirety by reference.

Each thermoelectric element may include a solder layer 609, a P-type or N-type layer 603a or 603b of a thermoelectric material, a copper pillar 611b, and a solder layer 615b on the conductive trace 607b. By way of example, P-type and N-type thermoelectric elements may be separately formed as shown in FIGS. 6C and 6D and then soldered to the conductive trace 607b as shown in FIG. 6A. If the thermoelectric elements are separately formed as shown in FIGS. 6C and 6D, the thermoelectric elements may be soldered to the conductive trace 607b before or after forming the copper pillars 611a and solder layers 615a. Methods of forming P-type and N-type thermoelectric elements are discussed by way of example in: U.S. patent application Ser. No. 11/472,032 entitled "Methods Of Forming Thermoelectric Devices Including Conductive Posts And/Or Different Solder Materials And Related Methods And Structures"; U.S. patent application Ser. No. 11/472,913 entitled "Methods Of Forming Thermoelectric Devices Including Electrically Insulating Matrixes Between Conductive Traces And Related Structures"; U.S. patent application Ser. No. 11/563,443 entitled "Methods Of Forming Embedded Thermoelectric Coolers With Adjacent Thermally Conductive Fields And Related Structures"; and U.S. patent application Ser. No. 11/681,303 "Methods Of Forming Thermoelectric Devices Using Islands Of Thermoelectric Material And Related Structures." The disclosures of the above referenced patent applications are hereby incorporated herein in their entirety by reference. According to some embodiments of the present invention, thermoelectric elements may be formed on the conductive trace 607b as discussed above with respect to the thermoelectric elements of FIG. 2C.

According to other embodiments of the present invention, the P-type and N-type layers 603a and 603b may be soldered to the conductive trace 607b before forming the copper pillars 611a and solder layers 615a. The copper pillars 611a and 611b and the solder layers 615a and 615b may then be formed together, for example, by plating.

The solder layers 615a and 615b on the IC chip 605 may then be aligned and placed in contact with respective bonding pads 617 of the packaging substrate 619. Once in contact, the solder layers 615a and 615b may be subjected to reflow operation and then cooled to provide solder bonds between the copper pillars 611a and 611b and bonding pads 617 to provide a flip chip interconnection between an active side of the IC chip 605 and the packaging substrate 619. The metal interconnection structures (including copper pillars 611a and solder layers 615a) may provide electrical interconnections between respective circuits on the active side of the IC chip 605 and traces on the packaging substrate 619. The packaging substrate 619, for example, may be a printed circuit board (PCB) including multiple levels of wiring interconnections, and the metal interconnections (including copper pillars 611a and solder layers 615a) may be electrically coupled to conductive traces provided at one or more levels and/or conductive vias of the PCB.

Similarly, each thermoelectric element (including P-type or N-type layer 603a or 603b of thermoelectric material) may be electrically coupled to a respective conductive trace provided at one or more levels and/or conductive vias of the PCB. The packaging substrate 619, for example, may provide electrical coupling between the thermoelectric elements and a controller to provide cooling, heating, and/or power generation using the thermoelectric elements.

If the packaging substrate 619 is thermally insulating, a thermally conductive via 623 (such as a copper via) may be provided through the packaging substrate 619 to increase heat transfer from the thermoelectric elements through the packaging substrate 619. By providing a thin electrically insulating layer 621, electrical isolation between the bonding pads 617 may be provided without significantly reducing heat transfer through the packaging substrate 619. A heat spreader or other heat dissipating structure 651 may be provided adjacent the thermally conductive via 623 opposite the thermoelectric elements to further enhance heat transfer from the thermoelectric elements. For example, a heat sink, a heat pipe, or other heat dissipating structure may be provided adjacent the thermally conductive via 623 opposite the thermoelectric elements.

The pads 607a of the IC chip 605 may provide electrical coupling to circuits on the active side of the IC chip 605. Each pad 607a, for example, may be an input/output pad, a power pad, and/or a ground pad electrically coupled to circuitry on the active side of the IC chip 605. The trace 607b, however, may be electrically isolated from circuitry on the active side of the IC chip 605. Instead the trace 607b may provide a series electrical connection between the thermoelectric element including the P-type thermoelectric layer 603a and the thermoelectric element including the N-type thermoelectric layer 603b. Accordingly, the thermoelectric elements of opposite conductivity type may be electrically connected in series with each other and thermally connected in parallel between the IC chip 605 and the packaging substrate 619. While portions of the pads/traces 607a and 607b are shown as being exposed opposite the IC chip 605, portions of the pads/traces 607a and 607b may be covered by a passivation layer(s) of the IC chip 605. For example, edges of the pads/traces 607a and 607b and/or portions of the trace 607b between the layers of thermoelectric material 603a and 603b may be covered by a passivation layer.

Operations of FIGS. 6A and 6B are provided by way of example, but variations thereof may be performed according to other embodiments of the present invention. For example, the copper pillars 611a and 611b may be provided on the IC chip 605 as shown in FIG. 6A without providing solder thereon. Instead, solder layers 615a and 615b may be provided on the pads 617 of the packaging substrate 619 of FIG. 6A. According to still other embodiments of the present invention, the metal interconnection structures and the thermoelectric elements may be formed/provided on the packaging substrate 619 and then bonded to the IC chip 605.

While not shown in FIGS. 6A and 6B, metal traces may be provided in insulating layers on the active side of the IC chip 605 and the metal traces may be configured to conduct heat to the thermoelectric elements including the P-type thermoelectric layer 603a and the N-type thermoelectric layer 603b as discussed above with respect to metal traces 501 of FIG. 5. Such metal traces may be electrically isolated from electronic circuitry on the active side of the IC chip 605, or such metal traces may also provide electrical interconnection for electronic circuitry on the active side of the IC chip 605.

Figure 7A:
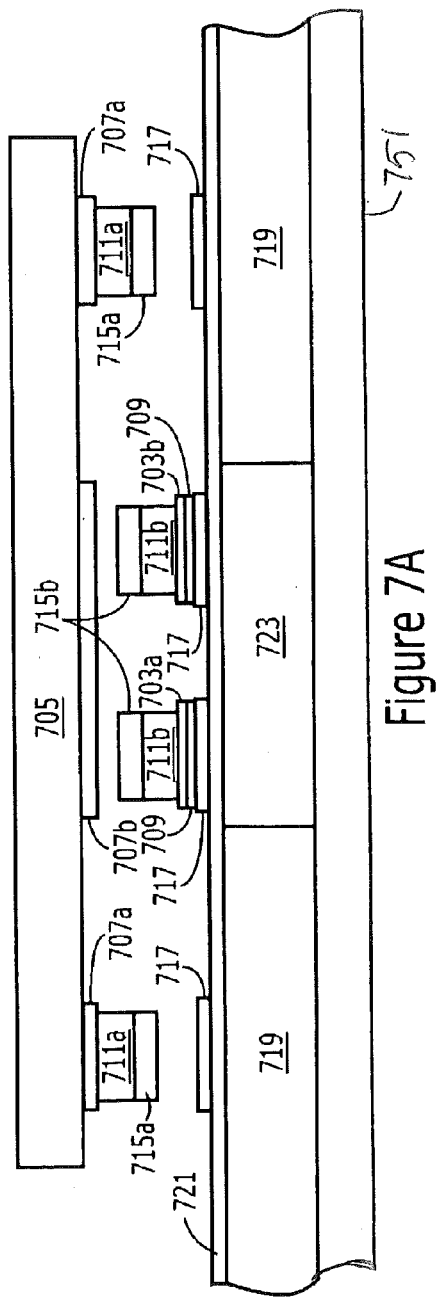
FIGS. 7A and 7B are cross sectional views illustrating operations of forming an electronic assembly according to some other embodiments of the present invention.
Figure 7B:
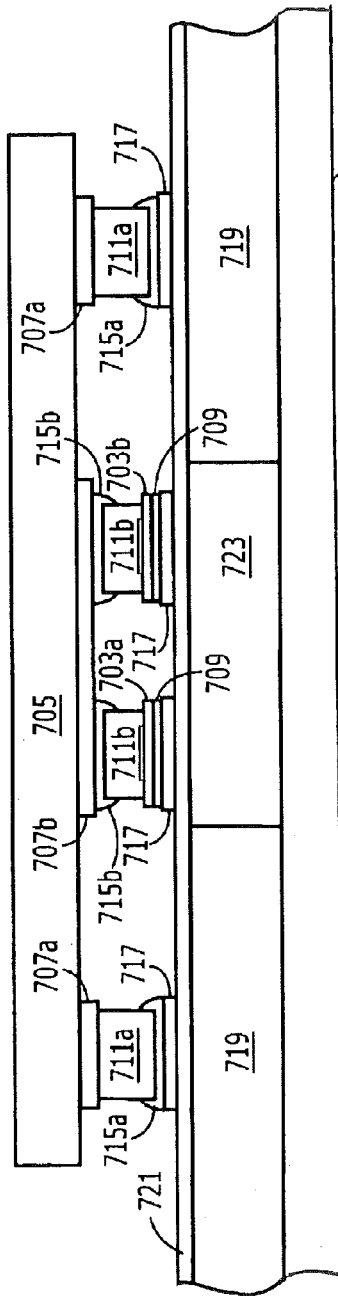

FIGS. 7A and 7B are cross sectional views illustrating operations of forming an electronic assembly according to some other embodiments of the present invention. As shown in FIG. 7A, a packaging substrate 719 may include an electrically insulating layer 721 thereon and a plurality of bonding traces/pads 717 corresponding to respective pads/traces 707a-b of integrated circuit (IC) semiconductor chip 705. Before bonding the IC chip 705 and the packaging substrate 719, metal interconnections structures may be provided on the pads 707a of the IC chip 705, and P-type and N-type thermoelectric elements may be provided on respective pads 717 of the packaging substrate 719.

Each metal interconnection structure, for example, may include a copper pillar 711a and a solder layer 715a on a respective conductive copper pad 707a. The copper pillars 711a and solder layers 715a may be formed as discussed, for example, by Joachim Kloeser et al. in the reference entitled "High-Performance Flip Chip Packages With Copper Pillar Bumping" (Global SMT & Packaging, May 2006, pages 28-31), the disclosure of which is hereby incorporated herein in its entirety by reference.

Each thermoelectric element may include a solder layer 709, a P-type or N-type layer 703a or 703b of a thermoelectric material, a copper pillar 711b, and a solder layer 715b on respective conductive pads 717. By way of example, P-type and N-type thermoelectric elements may be separately formed as shown in FIGS. 6C and 6D and then soldered to conductive pads 717 as shown in FIG. 7A. Methods of forming P-type and N-type thermoelectric elements are discussed by way of example in: U.S. patent application Ser. No. 11/472,032 entitled "Methods Of Forming Thermoelectric Devices Including Conductive Posts And/Or Different Solder Materials And Related Methods And Structures"; U.S. patent application Ser. No. 11/472,913 entitled "Methods Of Forming Thermoelectric Devices Including Electrically Insulating Matrixes Between Conductive Traces And Related Structures"; U.S. patent application Ser. No. 11/563,443 entitled "Methods Of Forming Embedded Thermoelectric Coolers With Adjacent Thermally Conductive Fields And Related Structures"; and U.S. patent application Ser. No. 11/681,303 "Methods Of Forming Thermoelectric Devices Using Islands Of Thermoelectric Material And Related Structures." According to some embodiments of the present invention, thermoelectric elements may be formed on the conductive pads 717 as discussed above with respect to the thermoelectric elements of FIG. 2C.

The solder layers 715a on the IC chip 705 and the solder layers 715b on the packaging substrate 719 may then be aligned and placed in contact with respective bonding pads 717 of the packaging substrate 719 and with the trace 707b of the IC chip 705. Once in contact, the solder layers 715a and 715b may be subjected to a reflow operation and then cooled to provide solder bonds between the copper pillars 711a and respective bonding pads 717 and between copper pillars 711b and the trace 707b to provide a flip chip interconnection between an active side of the IC chip 705 and the packaging substrate 719. The metal interconnection structures (including copper pillars 711a and solder layers 715a) may provide electrical interconnections between respective circuits on the active side of the IC chip 705 and traces on the packaging substrate 719. The packaging substrate 719, for example, may be a printed circuit board (PCB) including multiple levels of wiring interconnections, and the metal interconnections (including copper pillars 711a and solder layers 715a) may be electrically coupled to conductive traces provided at one or more levels and/or conductive vias of the PCB.

Similarly, each thermoelectric element (including P-type or N-type layer 703a or 703b) may be electrically coupled to a respective conductive trace provided at one or more levels and/or conductive vias of the PCB. The packaging substrate 719, for example, may provide electrical coupling between the thermoelectric elements and a controller to provide cooling, heating, and/or power generation using the thermoelectric elements.

If the packaging substrate 719 is thermally insulating, a thermally conductive via 723 (such as a copper via) may be provided through the packaging substrate 719 to increase heat transfer from the thermoelectric elements through the packaging substrate 719. By providing a thin electrically insulating layer 721, electrical isolation between the bonding pads 717 may be provided without significantly reducing heat transfer through the packaging substrate 719. A heat spreader or other heat dissipating structure 651 may be provided adjacent the thermally conductive via 723 opposite the thermoelectric elements to further enhance heat transfer from the thermoelectric elements. For example, a heat sink, a heat pipe, or other heat dissipating structure may be provided adjacent the thermally conductive via 673 opposite the thermoelectric elements.

The pads 707a of the IC chip 705 may provide electrical coupling to circuits on the active side of the IC chip 705. Each pad 707a, for example, may be an input/output pad, a power pad, and/or a ground pad electrically coupled to circuitry on the active side of the IC chip 705. The trace 707b, however, may be electrically isolated from circuitry on the active side of the IC chip 705. Instead the trace 707b may provide a series electrical connection between the thermoelectric element including the P-type thermoelectric layer 703a and the thermoelectric element including the N-type thermoelectric layer 703b. Accordingly, the thermoelectric elements of opposite conductivity type may be electrically connected in series with each other and thermally connected in parallel between the IC chip 705 and the packaging substrate 719. While portions of the pads/traces 707a and 707b are shown as being exposed opposite the IC chip 705, portions of the pads/traces 707a and 707b may be covered by a passivation layer(s) of the IC chip 705. For example, edges of the pads/traces 707a and 707b and/or portions of the trace 707b between the layers of thermoelectric material 703a and 703b may be covered by a passivation layer.

Operations of FIGS. 7A and 7B are provided by way of example, but variations thereof may be performed according to other embodiments of the present invention. For example, the copper pillars 711a may be provided on the IC chip 705 and the copper pillars 711b may be provided on the packaging substrate 719 as shown in FIG. 7A without providing solder thereon. Instead, solder layers 715a may be provided on the respective pads 717 of the packaging substrate 719 of FIG. 7A, and solder layers 715b may be provided on the conductive trace 707b of the IC chip 705 of FIG. 7A. According to still other embodiments of the present invention, the metal interconnection structures may be formed/provided on the packaging substrate 719 of FIG. 7A, and the thermoelectric elements may be formed/provided on the IC chip 705 of FIG. 7A, and then the IC chip 705 and the packaging substrate 719 may be bonded.

By providing the P-type and N-type layers 703a and 703b of thermoelectric material adjacent the thermally conductive via 723, transfer of heat generated by the layers of thermoelectric material may be more easily conducted away from the IC chip 705. Stated in other words, by providing the copper pillars 711b between the thermoelectric material and the IC chip 705, transfer of heat generated by the thermoelectric material to the IC chip 705 may be reduced.

While not shown in FIGS. 7A and 7B, metal traces may be provided in insulating layers on the active side of the IC chip 705 and the metal traces may be configured to conduct heat to the thermoelectric elements including the P-type thermoelectric layer 703a and the N-type thermoelectric layer 703b as discussed above with respect to metal traces 501 of FIG. 5. Such metal traces may be electrically isolated from electronic circuitry on the active side of the IC chip 705, or such metal traces may also provide electrical interconnection for electronic circuitry on the active side of the IC chip 705.

Figure 8:
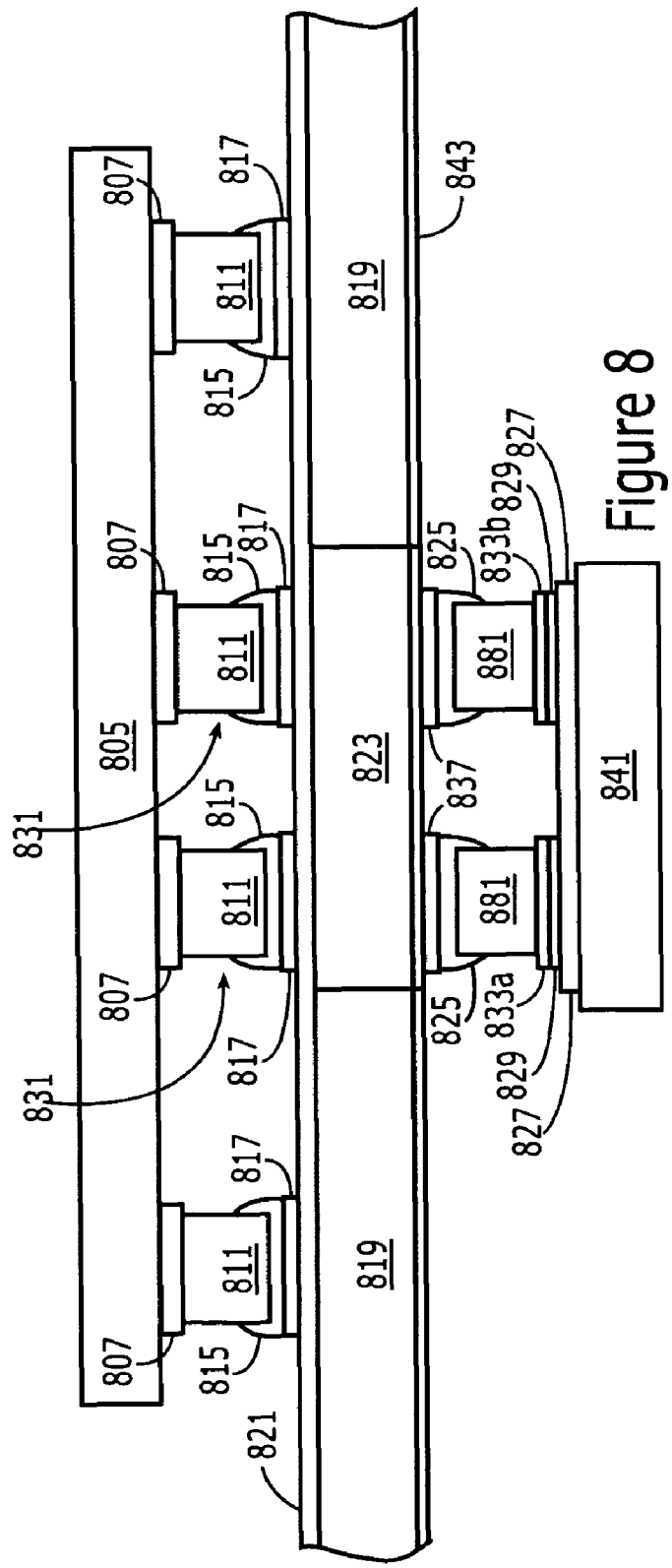
FIG. 8 is a cross sectional view illustrating an electronic assembly according to still other embodiments of the present invention and operations of forming the same.

FIG. 8 is a cross sectional view illustrating an electronic assembly according to still other embodiments of the present invention and operations of forming the same. As shown in FIG. 8, a packaging substrate 819 may include an electrically insulating layer 821 thereon and a plurality of bonding pads 817 corresponding to respective pads 807 of integrated circuit (IC) semiconductor chip 805. Before bonding the IC chip 805 and the packaging substrate 819, metal interconnection structures may be provided on the pads 807a of the IC chip 805.

Each metal interconnection structure, for example, may include a copper pillar 811 and a solder layer 815 on a respective conductive copper pad 807. The copper pillars 811a and solder layers 815a may be formed as discussed, for example, by Joachim Kloeser et al. in the reference entitled "High-Performance Flip Chip Packages With Copper Pillar Bumping" (Global SMT & Packaging, May 2006, pages 28-31), the disclosure of which is hereby incorporated herein in its entirety by reference.

The solder layers 815 on the IC chip 805 may then be aligned and placed in contact with respective bonding pads 817 of the packaging substrate 819. Once in contact, the solder layers 815 may be subjected to a reflow operation and then cooled to provide solder bonds between the copper pillars 811 and respective bonding pads 817 to provide a flip chip interconnection between an active side of the IC chip 805 and the packaging substrate 819. The metal interconnection structures (including copper pillars 811 and solder layers 815a) may provide electrical interconnections between respective circuits on the active side of the IC chip 805 and traces on the packaging substrate 819. The packaging substrate 819, for example, may be a printed circuit board (PCB) including multiple levels of wiring interconnections, and the metal interconnections (including copper pillars 811 and solder layers 815) may be electrically coupled to conductive traces provided at one or more levels and/or conductive vias of the PCB.

If the packaging substrate 819 is thermally insulating, a thermally conductive via 823 (such as a copper via) may be provided through the packaging substrate 819 to increase heat transfer from the thermoelectric elements through the packaging substrate 819. By providing a thin electrically insulating layer 821, electrical isolation between the bonding pads 817 may be provided without significantly reducing heat transfer through the packaging substrate 819. The pads 807 of the IC chip 805 may provide electrical coupling to circuits on the active side of the IC chip 805. Each pad 807, for example, may be an input/output pad, a power pad, and/or a ground pad electrically coupled to circuitry on the active side of the IC chip 805.

As shown in FIG. 8, metal interconnection structures 831 adjacent thermally conductive via 823 may provide thermal coupling between the active side of IC chip 805 and the packaging substrate 819. The pads 807 of metal interconnection structures 831 may be electrically coupled to circuitry on the active side of the IC chip 805 as discussed above, and the bonding pads 817 on the packaging substrate 819 may be coupled to conductive traces of the packaging substrate 819 to provide input/output signals, power, and/or ground connections through the metal interconnection structures 831. According to other embodiments of the present invention, the pads 807 of metal interconnection structures 831 may be dummy pads provided for heat transfer but not for electrical interconnection between the IC chip 807 and the packaging substrate 819. If the dummy pads are electrically isolated from circuitry of the IC chip 805, for example, the electrically insulating layer 821 may be omitted between the metal interconnection structures 831 and the thermally conductive via 823 to increase heat transfer between the metal interconnection structures 831 and the thermally conductive via 823.

While portions of the pads 807 are shown as being exposed opposite the IC chip 805, portions of the pads 807 may be covered by a passivation layer(s) of the IC chip 805. For example, edges of the pads 807 may be covered by a passivation layer. As shown in FIG. 8, a thermoelectric P-N couple(s) may be provided on a back side of the packaging substrate 819 opposite the IC chip 805. Each thermoelectric element may include a solder layer 829, a P-type or N-type layer 833a or 833b of a thermoelectric material, a copper pillar 881, and a solder layer 825 on respective conductive pads 837. By way of example, P-type and N-type thermoelectric elements may be separately formed as shown in FIGS. 6C and 6D and then soldered to conductive pads 837 and/or 827 as shown in FIG. 8. Methods of forming P-type and N-type thermoelectric elements are discussed by way of example in: U.S. patent application Ser. No. 11/472,032 entitled "Methods Of Forming Thermoelectric Devices Including Conductive Posts And/Or Different Solder Materials And Related Methods And Structures"; U.S. patent application Ser. No. 11/472,913 entitled "Methods Of Forming Thermoelectric Devices Including Electrically Insulating Matrixes Between Conductive Traces And Related Structures"; U.S. patent application Ser. No. 11/563,443 entitled "Methods Of Forming Embedded Thermoelectric Coolers With Adjacent Thermally Conductive Fields And Related Structures"; and U.S. patent application Ser. No. 11/681,303 "Methods Of Forming Thermoelectric Devices Using Islands Of Thermoelectric Material And Related Structures." According to some embodiments of the present invention, thermoelectric elements may be formed on the conductive trace 827 as discussed above with respect to the thermoelectric elements of FIG. 2C.

Each thermoelectric element (including P-type or N-type layer 833a or 833b) may be electrically coupled through a conductive pad 837 to a respective conductive trace provided at one or more levels and/or conductive vias of the packaging substrate 819. The packaging substrate 819, for example, may provide electrical coupling between the thermoelectric elements and a controller to provide cooling, heating, and/or power generation using the thermoelectric elements. In addition, a thermally conductive header 841 may be provided on the electrically conductive trace 827 to enhance heat transfer from the thermoelectric elements. For example, a heat sink, a heat pipe, or other heat dissipating structure may be provided adjacent the thermally conductive trace 827 opposite the thermoelectric elements.

The trace 827 may provide a series electrical connection between the thermoelectric element including the P-type thermoelectric layer 833a and the thermoelectric element including the N-type thermoelectric layer 833b. Accordingly, the thermoelectric elements of opposite conductivity type may be electrically connected in series with each other and thermally connected in parallel between the packaging substrate 819 and the header 841. An electrically insulating layer 843 may provide electrical isolation between the pads 837 and the conductive via 823 without significantly reducing transfer of heat therebetween.

Operations discussed above with respect to FIG. 8 are provided by way of example, but variations thereof may be performed according to other embodiments of the present invention. For example, the copper pillars 811 and the solder layers 815 may be provided on the IC chip 805 before bonding with the packaging substrate 819, or copper pillars and solder layers may be provided on the packaging substrate 819 before bonding with the IC chip 805. Moreover, copper pillars 811 may be provided on the IC chip 805 and solder layers 817 may be provided on the packaging substrate 819 before bonding the IC chip with the packaging substrate, or copper pillars may be provided on the packaging substrate 819 and solder layers may be provided on the IC chip 809 before bonding the IC chip with the packaging substrate.

An order of bonding the IC chip 805 to the packaging substrate and bonding the header 841 to the packaging substrate may also be reversed. For example, the IC chip 805 may be bonded to the packaging substrate 819 before bonding the header 841 to the packaging substrate 819, or the IC chip 805 may be bonded to the packaging substrate 819 after bonding the header 841 to the packaging substrate 819. Moreover, the thermoelectric elements may be assembled on the header 841 and then bonded to the packaging substrate 819, or the thermoelectric elements may be assembled on the packaging substrate 819 and then bonded to the header 841.

By providing the P-type and N-type layers 833a and 833b of thermoelectric material adjacent the header 841, transfer of heat generated by the layers of thermoelectric material may be more readily conducted away from the packaging substrate 819. Stated in other words, by providing the copper pillars 881 between the thermoelectric material and the packaging substrate 819, transfer of heat generated by the thermoelectric material to the packaging substrate 819 may be reduced. Moreover, a separate thermally conductive via 823 may be omitted if the packaging substrate 819 is thermally conductive. If the packaging substrate 819 is electrically insulating, separate insulating layers 821 and 843 may be omitted.

While not shown in FIG. 8, metal traces may be provided in insulating layers on the active side of the IC chip 805 and the metal traces may be configured to conduct heat to the metal interconnection structures 831 as discussed above with respect to metal traces 501 of FIG. 5. Such metal traces may be electrically isolated from electronic circuitry on the active side of the IC chip 805, or such metal traces may also provide electrical interconnection for electronic circuitry on the active side of the IC chip 805.

While not shown in FIG. 6B or 7B, the thermoelectric elements of FIG. 8 may be provided on the packaging substrate 619 of FIG. 6B or on the packaging substrate 719 of FIG. 7B to provide two stage thermoelectric heat transfer on both sides of the respective packaging substrate. In addition or in an alternative, passive and/or active heat transfer may be provided on backsides of IC chips 605, 705, and/or 805 (opposite the packaging substrate 619, 719, and/or 819) to further increase heat transfer. A heat sink and/or a thermoelectric cooler for example, may be provided on a back side of the IC chip.

By providing thermoelectric cooling on an active side of a flip chip mounted IC chip 605, 705, and/or 805 as shown in FIGS. 6B, 7B, and 8, an efficiency of cooling circuitry on the active side of the IC chip may be improved because heat transfer through a thickness of the IC chip to a back side thereof is not required. Moreover, an alignment of thermoelectric cooling elements to a particular hot spot may be improved because alignment may be made with respect to the active side of the IC chip. In addition, wiring between thermoelectric cooling elements and a controller thereof may be provided using conductive traces on/through the packaging substrate without requiring wiring to a back side of the IC chip. A cost and/or complexity of assembling thermoelectric cooling elements may also be reduced by integrating assembly of thermoelectric cooling elements with flip chip bonding of the IC chip and packaging substrate as shown in FIGS. 6A-6B and 7A-7B.

Figure 9:
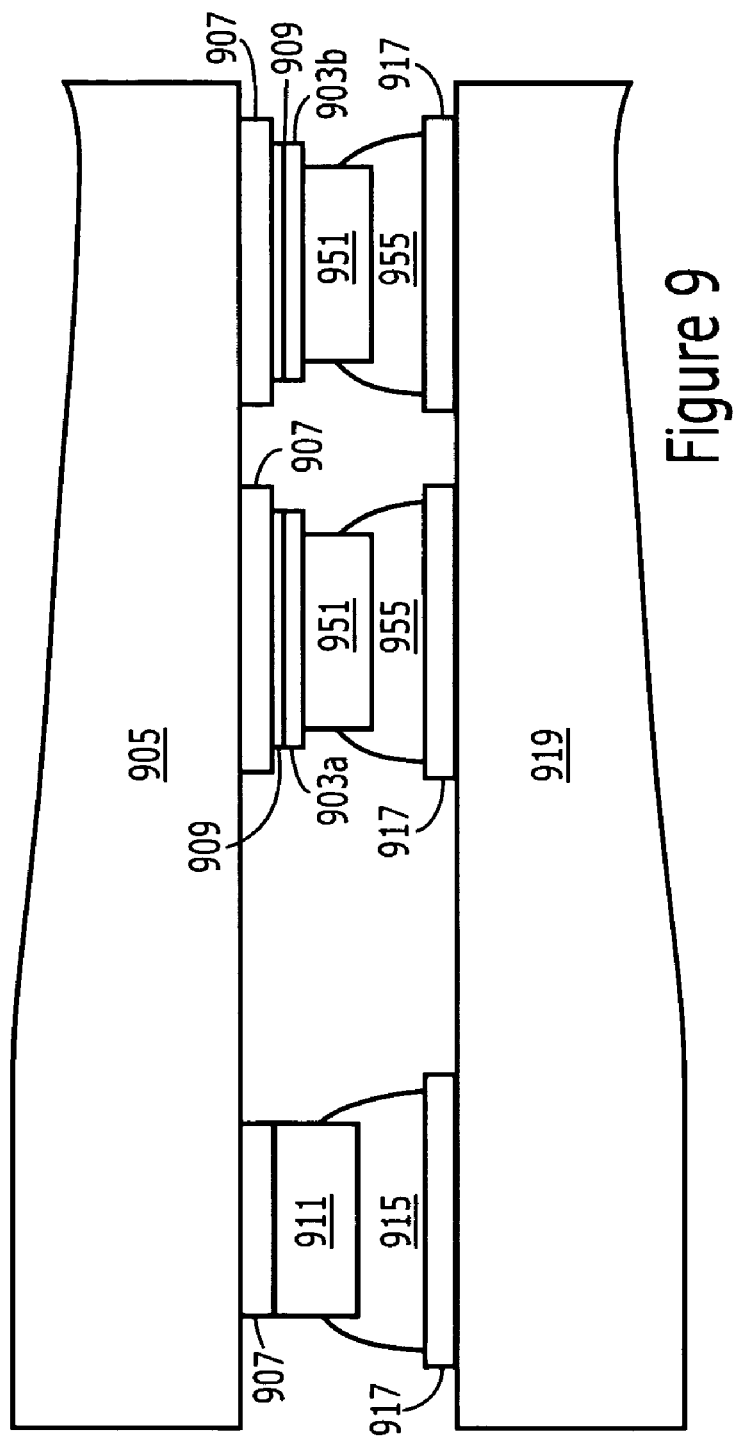
FIG. 9 is a cross-sectional schematic view illustrating structures of a copper pillar bump (CPB) and a thin-film thermoelectric copper pillar bump (TECPB) semiconductor chip assembly according to some embodiments of the present invention.

FIG. 9 is a cross-sectional schematic view illustrating structures of a CPB and thin-film TECPBs integrated in a semiconductor chip assembly according to still other embodiments of the present invention having structures similar to those discussed above respect to FIG. 4. In the structure of FIG. 9, however, one or more TECPBs may provide both thermoelectric heat pumping and a signal/power/ground connection for an electronic circuit(s) of the chip 905. In other words, the TECPBs of FIG. 9 may be electrically active with respect to the chip 905. The CPB and TECPB structures both include copper pillars 911 and 951, respectively, and solder connections 915 and 955, respectively. Each TECPB may also include a respective layer of thermoelectric material 903a or 903b between solder layers 909 and 955. The solders used with CPBs and TECPBs can be any one of a number of commonly used solders including, but not limited to, SnPb (tin lead) eutectic, SnAg (tin silver) and/or AuSn (gold tin). Moreover, input/output pads 907 of the chip 905 may provide respective signal/power/ground for an electronic circuit(s) of the chip 905.

Accordingly, the input/output pads 907, solder layers 909, layers of TE material 903a and 903b, copper pillars 911 and 951, and solder layers 915 and 955 may be formed on an active side of the IC semiconductor chip 905 before dicing the chip 905 from a processing wafer (including a plurality of such chips). The chip 905 can then be diced from the wafer and bonded to traces 917 of packaging substrate 919 using solder 915 and 955. The copper pillar 911 and solder 915 may provide electrical coupling between an electronic circuit(s) on the active side of the chip 905 and the respective trace 917 of the packaging substrate 919, and electrically conductive traces and/or vias in/on the packaging substrate 919 may provide electrical coupling with other electronic components. The traces 917 may provide electrical coupling (through electrically conductive traces and/or vias in/on the packaging substrate 919) with a controller providing electrical power, electrical ground, and/or input/output signals for the chip 905.

The TECPBs (including respective thermoelectric layers 903a and 903b, copper pillars 951, and solder layers 955 and 909), for example, may be coupled to respective input/output pads 907 providing power and/or ground for the chip 905. Accordingly, level of cooling may vary in response to variations in a current through the power and/or ground of the chip 905, so that a level of cooling may increase with increasing power consumed by the chip 905 (when the chip 905 is likely to generate more heat) and decrease with decreasing power consumed by the chip 905 (when the chip 905 is likely to generate less heat). According to different embodiments of the present invention, multiple TECPBs (e.g., including thermoelectric layers 903a and 903b) may be coupled to input/output pads 907 providing electrical power with both thermoelectric layers 903a and 903b having the same conductivity type; both TECPBs (e.g., including thermoelectric layers 903a and 903b) may be coupled to input/output pads 907 providing an electrical ground with both thermoelectric layers 903a and 903b having the same conductivity type; or one TECPB (e.g., including thermoelectric layer 903a) may be coupled to an input/output pad 907 providing power and another TECPB (e.g., including thermoelectric layer 903b) may be coupled to an input/output pad 907 providing electrical ground with thermoelectric layers 903a and 903b having opposite conductivity types. According to other embodiments of the present invention, a single electrically active TECPB may be used, and/or an electrically active TECPB(s) of FIG. 9 may be combined with an electrically isolated TECPB(s) of FIG. 4.

The CPB (including copper pillar 911 and solder 915 without thermoelectric material), for example, may provide electrical coupling with an input/output signal pad, an electrical ground pad, and/or an electrical power pad of the chip 905. While one CPB is shown by way of example in FIG. 9, any number of CPBs may be provided, for example, for any number of respective input/output signal pads according to some embodiments of the present invention. According to other embodiments of the present invention, all electrical interconnection between adjacent surfaces of the chip 905 and the packaging substrate 919 may be provided using TECPBs so that no CPBs are required. Moreover, a thermally conductive via(s) may be provided through the packaging substrate 919 adjacent the TECPBs to enhance thermal conduction through the packaging substrate 919.

If the chip 905 is a two terminal device (such as a diode, a laser diode, a light emitting diode, etc.), each of the TECPBs (including respective thermoelectric layers 903a and 903b) may be coupled to a respective anode/cathode, power/ground, input/output, etc., and the thermoelectric layers 903a and 903b may have opposite conductivity types. Accordingly, both thermoelectric layers 903a and 903b may provide cooling with current flows in opposite directions, and levels of cooling may in proportion to levels of current flow through the chip 905. If the chip 905 is a three terminal device (such as a transistor) a CPB (without a thermoelectric layer) may provide coupling with a control electrode (such as a base, gate, etc.) and a TECPB may provide coupling with a controlled electrode (such as an anode, cathode, emitter, collector, drain, source, etc.).

If the chip 905 is a vertical device, one or more TECPBs may provide cooling and electrical coupling between the packaging substrate 919 and a surface of the chip 905 adjacent the substrate 919, and separate electrical couplings may be provided for a surface of the chip 905 opposite the substrate 919. In such a vertical device, for example, wire bonds may be provided between the substrate 919 and a surface of the chip 905 opposite the substrate 919. In a vertical diode (such as a light emitting diode or laser diode), for example, on TECPB (or a plurality of TECPBs having thermoelectric layers with a same conductivity type) may provide cooling and electrical coupling between the substrate 919 and first electrode of the chip 905, and a wirebond may provide an electrical coupling between the substrate 919 and a second electrode of the chip 905.

While orderings of layers of the CPB and TECPBs of FIG. 9 are illustrated by way of example, other orderings may be provided. For example, the copper pillars 911 and 951 may be provided between the respective solder layers 915 and 955 and the substrate 919, and/or the thermoelectric layers 903a and 903b may be provided between the respective solder layers 955 and the substrate 919. The structure of FIG. 9 may be fabricated using techniques, for example, such as those discussed above with respect to FIGS. 6A-6D, 7A-7B, and/or 8.

As used herein, the term packaging substrate may include any substrate to which an integrated circuit chip or other electronic device may be bonded to provide a chip scale package. By way of example, a packaging substrate may be a printed circuit board substrate, a laminate carrier substrate, a chip carrier substrate, a ball grid array substrate, a pin grid array substrate, a flip chip package substrate, a printed wire board, etc. Moreover, a packaging substrate may be further mounted to another substrate so that the packaging substrate is an intermediate substrate between the integrated circuit device and the other substrate and so that the packaging substrate provides electrical coupling between the integrated circuit device and the other substrate. The packaging substrate 619 of FIG. 6B or the packaging substrate 719 of FIG. 7B, for example, may be electrically and mechanically mounted to a printed circuit board so that the packaging substrate is between the IC chip and the printed circuit board. In FIG. 8, the header 841 may be included as a portion of a printed circuit board that is electrically coupled to the IC chip 805 through the packaging substrate 819.

As used herein, the term thermoelectric element includes a structure having a layer of a thermoelectric material with a Seebeck coefficient (such as $Bi_2Te_3$) sufficient to provide thermoelectric heat pumping (heating or cooling) responsive to an electrical current therethrough and/or electrical power generation responsive to a temperature gradient across the thermoelectric element. A thermoelectric element, for example, may include one or more P-N couples with a P-N couple having a P-type thermoelectric element and an N-type thermoelectric element electrically coupled in series and thermally coupled in parallel and configured to provide thermoelectric heating, cooling, and/or power generation. According to other embodiments of the present invention, a thermoelectric element may include a single layer of a thermoelectric material (either P-type or N-type) configured to provide thermoelectric heating, cooling, and/or power generation.

As discussed above, copper pillars may be used together with solder to increase a height/thickness of a metal interconnection while reducing a width (e.g., providing a reduced pitch) and/or reducing a solder volume used. While copper pillars are discussed by way of example, pillars of other metals and/or alloys may be used. For example, pillars of metals and/or alloys having a melting point higher than that of the solder being used may be provided.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed:

1. An electronic assembly comprising:
   a packaging substrate having opposing first and second surfaces;
   an integrated circuit (IC) semiconductor chip having an active side including input/output pads thereon and a back side opposite the active side, wherein the IC semiconductor chip is arranged with the active side facing the first surface of the packaging substrate;
   a plurality of metal interconnection structures between the active side of the IC semiconductor chip and the first surface of the packaging substrate, wherein the plurality of metal interconnection structures provide mechanical connection between the active side of the IC semiconductor chip and the first surface of the packaging substrate; and
   a thermoelectric heat pump coupled to the packaging substrate, wherein the thermoelectric heat pump is configured to actively pump heat between the IC semiconductor chip and the packaging substrate,
   wherein the thermoelectric heat pump is between the packaging substrate and the IC semiconductor chip, wherein the thermoelectric heat pump comprises an n-type thermoelectric element electrically coupled to a first one of the metal interconnection structures and a p-type thermoelectric element electrically coupled to a second one of the metal interconnection structures, wherein the IC semiconductor chip includes an electrically conductive coupling between the first and second metal interconnection structures so that the n-type and p-type thermoelectric elements and the first and second metal interconnection structures are electrically coupled in series, wherein the n-type and p-type thermoelectric elements are thermally coupled in parallel between the IC semiconductor chip and the packaging substrate, wherein a third one of the metal interconnection structures is electrically coupled between an electronic circuit of the IC semiconductor chip and an electrically conductive trace of the packaging substrate, wherein the third metal interconnection structure is free of thermoelectric material, and wherein each of the first, second, and third metal interconnection structures includes a copper pillar and a solder material;
   wherein the packaging substrate includes a thermally conductive via between the first and second surfaces thereof, and wherein the thermally conductive via, and the first metal interconnection structure are thermally coupled in series between the active side of the IC semiconductor chip and the second surface of the packaging substrate;
   wherein the thermally conductive via is adjacent the first metal interconnection structure and spaced apart from the second metal interconnection structure in a direction that is parallel with respect to a surface of the packaging substrate.

2. An electronic assembly according to claim 1 wherein the packaging substrate includes a thermally conductive via between the first and second surfaces thereof, wherein at least a portion of the thermoelectric heat pump is between the thermally conductive via and the IC semiconductor chip.

3. An electronic assembly according to claim 1 further comprising:
   a heat dissipating structure thermally coupled to the thermoelectric heat pump, wherein the packaging substrate is between the IC semiconductor chip and the heat dissipating structure.

4. An electronic assembly according to claim 1 wherein the third metal interconnection structures provides electrical coupling between a circuit of the IC semiconductor chip and an electrically conductive trace of the packaging substrate.

5. An electronic assembly according to claim 1 wherein the packaging substrate comprises a thermally conductive packaging substrate.

6. An electronic assembly according to claim 1 wherein the thermally conductive via and the first metal interconnection structure are aligned in the direction parallel with respect to the surface of the packaging substrate.

7. An electronic assembly comprising:
a packaging substrate;
an integrated circuit (IC) semiconductor chip having an active side including input/output pads thereon, wherein the IC semiconductor chip is arranged with the active side facing the packaging substrate; and
a plurality of metal interconnection structures between the IC semiconductor chip and the packaging substrate, wherein a first metal interconnection structure includes a thermoelectric material, and wherein a second metal interconnection structure is free of thermoelectric material;
wherein the packaging substrate includes a thermally conductive via therethrough adjacent at least one of the metal interconnection structures including thermoelectric material;
wherein the thermally conductive via is adjacent the first metal interconnection structure and spaced apart from the second metal interconnection structure in a direction that is parallel with respect to a surface of the packaging substrate.

8. An electronic assembly according to claim 7 wherein the thermally conductive via and the first metal interconnection structure are aligned in the direction parallel with respect to the surface of the packaging substrate.

9. An electronic assembly comprising:
a packaging substrate;
an integrated circuit (IC) semiconductor chip having an active side including input/output pads thereon, wherein the IC semiconductor chip is arranged with the active side facing the packaging substrate; and
a plurality of metal interconnection structures between the IC semiconductor chip and the packaging substrate, wherein a first metal interconnection structure includes a thermoelectric material, wherein a second metal interconnection structure is free of thermoelectric material, and
wherein each of the metal interconnection structures includes a respective copper pillar and a respective solder bond so that the first metal interconnection structure includes the thermoelectric material, the respective copper pillar, and the respective solder bond electrically coupled in series between the IC semiconductor chip and the packaging substrate;
wherein the packaging substrate includes a thermally conductive via therethrough adjacent at least one of the metal interconnection structures including thermoelectric material;
wherein the thermally conductive via is adjacent the first metal interconnection structure and spaced apart from the second metal interconnection structure in a direction that is parallel with respect to a surface of the packaging substrate.

10. An electronic assembly according to claim 9 wherein the first metal interconnection structure includes an N-type thermoelectric material, wherein a third metal interconnection structure includes a P-type thermoelectric material, and wherein the first and third metal interconnection structures are electrically coupled so that the N-type thermoelectric material and the P-type thermoelectric material are electrically coupled in series to define a thermoelectric P-N couple.

11. An electronic assembly according to claim 9 wherein the thermally conductive via and the first metal interconnection structure are aligned in the direction parallel with respect to the surface of the packaging substrate.

* * * * *